US008171964B2

(12) United States Patent
Okabe

(10) Patent No.: US 8,171,964 B2
(45) Date of Patent: May 8, 2012

(54) APPARATUS AND METHOD FOR OPENING/CLOSING LID OF CLOSED CONTAINER, GAS REPLACEMENT APPARATUS USING SAME, AND LOAD PORT APPARATUS

(75) Inventor: Tsutomu Okabe, Tokyo (JP)

(73) Assignee: TDK Corporation, Tokyo (JP)

( * ) Notice: Subject to any disclaimer, the term of this patent is extended or adjusted under 35 U.S.C. 154(b) by 534 days.

(21) Appl. No.: 12/402,664

(22) Filed: Mar. 12, 2009

(65) Prior Publication Data
US 2009/0245978 A1 Oct. 1, 2009

(30) Foreign Application Priority Data
Mar. 27, 2008 (JP) ................................. 2008-082950

(51) Int. Cl.
*H01L 21/02* (2006.01)
(52) U.S. Cl. ........... 141/63; 141/66; 141/98; 414/217.1; 414/939
(58) Field of Classification Search .............. 141/63–66, 141/98; 414/217, 217.1, 935, 939
See application file for complete search history.

(56) References Cited

U.S. PATENT DOCUMENTS

| | | | | |
|---|---|---|---|---|
| 6,352,403 B1 * | 3/2002 | Fishkin et al. | ................. | 414/939 |
| 6,375,403 B1 * | 4/2002 | Mages et al. | .................. | 414/939 |
| 6,419,482 B1 * | 7/2002 | Sakata et al. | .................. | 432/250 |
| 6,867,153 B2 * | 3/2005 | Tokunaga | ....................... | 141/63 |
| 6,883,539 B2 * | 4/2005 | Inoue et al. | ..................... | 141/98 |
| 6,926,029 B2 * | 8/2005 | Inoue et al. | ..................... | 141/98 |
| 7,607,880 B2 * | 10/2009 | Okabe et al. | ............... | 414/217.1 |
| 7,670,095 B2 * | 3/2010 | Okabe et al. | ............... | 414/217.1 |
| 7,674,083 B2 * | 3/2010 | Miyajima et al. | .......... | 414/217.1 |
| 7,789,609 B2 * | 9/2010 | Okabe et al. | ................... | 414/217 |
| 7,841,371 B2 * | 11/2010 | Okabe | ............................. | 141/63 |
| 2007/0080096 A1 * | 4/2007 | Miyajima et al. | ............. | 206/710 |

FOREIGN PATENT DOCUMENTS

| | | |
|---|---|---|
| JP | 8-172120 | 7/1996 |
| JP | 2003-45933 | 2/2003 |
| JP | 2003-168727 | 6/2003 |
| JP | 2004-71784 | 3/2004 |
| JP | 2004-235516 | 8/2004 |
| JP | 2005-340243 | 12/2005 |
| JP | 2006-5193 | 1/2006 |

OTHER PUBLICATIONS

U.S. Appl. No. 12/624,579, filed Nov. 24, 2009, Okabe, et al.

* cited by examiner

*Primary Examiner* — Gregory Huson
*Assistant Examiner* — Nicolas A Arnett
(74) *Attorney, Agent, or Firm* — Oblon, Spivak, McClelland, Maier & Neustadt, L.L.P.

(57) ABSTRACT

The invention provides a purge apparatus that purges the gas in the interior of a FOUP with a high purging efficiency and an apparatus for opening/closing the lid of a FOUP for use in the purge apparatus. The purge apparatus has a cabinet having an opening portion through with the lid of the FOUP can pass, a door that can close the opening portion and hold the lid, and a gas supply nozzle provide in the cabinet. In this apparatus, a seal member is provided in such a way as to surround an element that is provided on the surface of the door and adapted to actuate a latch mechanism of the lid. The seal member spatially separates the element that is adapted to actuate the latch mechanism from the external space in a state in which the door is holding the lid.

3 Claims, 7 Drawing Sheets

APPARATUS AND METHOD FOR OPENING/CLOSING LID OF CLOSED CONTAINER, GAS REPLACEMENT APPARATUS USING SAME, AND LOAD PORT APPARATUS

This application claims priority from Japanese Patent Application No. 2008-082950 filed on Mar. 27, 2008, which is hereby incorporated by reference herein.

BACKGROUND OF THE INVENTION

1. Field of the Invention

The present invention relates to an apparatus and a method for opening and closing a lid of a closed container that is used to transport silicon wafers or the like between semiconductor processing apparatuses in a semiconductor manufacturing process etc. More specifically, the closed container is a container in which silicon wafers are stored and that is used to transport the wafers between the semiconductor processing apparatuses, and the present invention relates to an apparatus that opens and closes the lid of the container, a gas replacement apparatus that replaces the gas in the interior of the container, and what is called a FIMS (Front-Opening Interface Mechanical Standard) system or a load port apparatus that detaches the lid from the container to take out silicon wafers from the container and to allow transfer of the wafers into/out of the container.

2. Related Background Art

Previously, the semiconductor manufacturing process had been performed in what is called a clean room that is constructed by establishing a high degree of cleanliness in the room in which semiconductor wafers are handled. In recent years, however, in view of an increase in the wafer size and with a view to reduce cost incurred in maintenance of the clean room, use has been made of a method of keeping clean only the interior of a processing apparatus, a pod (i.e. a closable container for storing wafers) and a mini environment through which substrates or wafers are transferred between the pod and the processing apparatus.

The pod is a closed container composed of a substantially cubical main body having shelves provided therein that can hold a plurality of wafers in a parallel and separated state and an opening provided on one of the sides or external walls thereof through which wafers can be brought into/out of it, and a lid for closing the opening. Those pods which have an opening provided not on the bottom but on one lateral side thereof (i.e. the front side to be opposed to the aforementioned mini environment) are collectively called FOUPs (Front-Opening Unified Pods). The present invention mainly pertains to technologies that use the FOUP.

When wafers are stored in the pod, the interior of the pod is filled with so-called clean air from which contaminants such as dust have been excluded as much as possible to prevent contaminants such as dust from attaching to the wafers while the wafers are stored. In recent years, with decreases in the size of semiconductor devices and with enhancements of their performance, oxidization of the surface of the wafer or the surface of layers formed on the wafer by oxidizing atmosphere during wafer storage has become a problem. In view of this, it has been considered desirable that the interior space of the pod be filled with clean inert gas such as nitrogen gas. It has been considered more desirable that the interior space of the pod be filled with inert gas that is kept at a pressure higher than the pressure in the environment outside the pod.

To fill the interior space of the pod with inert gas, a load port apparatus (that is, an apparatus adapted to open/close the door of a pod to enable transfer of wafers into/out of the interior of the pod) like that disclosed in Japanese Patent Application Laid-Open No. 2004-235516 is typically used, and the lid is closed while inert gas is being supplied to the interior of the pod after all of the predetermined wafers have been inserted into the interior to achieve a desired enclosure condition. However, it is well known that the pressure in the interior of the pod in which the wafers are enclosed decreases with time, and the enclosure condition is degraded from a preferred condition with time. In view of this, a gas purge system as disclosed in, for example, Japanese Patent Application Laid-Open No. 2006-005193 may be used to purge the interior of the pod again using fresh, clean inert gas at an appropriate timing. In the system disclosed in Japanese Patent Application Laid-Open No. 2006-005193, supply of the inert gas into the interior of the pod and discharge of the gas that has been enclosed in the interior are performed at the same time using an inert gas supply port and an exhaust port provided on the bottom of the pod to achieve gas purging.

In another method disclosed in Japanese Patent Application 2003-168727, the pod is kept in the interior of a closable chamber, and the inert gas in the interior of the pod is replace by fresh, clean gas by sequential operations of opening the lid of the pod in the chamber, reducing the pressure in the interior of the chamber and the pod, and supplying inert gas into the chamber and the pod.

However, there is a possibility that the following problem is encountered or will be encountered in the future by the above described prior art methods when they are put into practice. Specifically, in the case of the method disclosed in Japanese Patent Application Laid-Open No. 2004-235516, it is difficult to achieve sealing of the above-mentioned so-called mini environment since a drive system for means for holding the lid of the pod is provided. Therefore, the degree of purity of the inert gas supplied into the interior of the pod is hard to be enhanced beyond a certain level. Furthermore, there are many driving elements in the mini environment, and dust generated from such elements will be stirred up by down-flow produced in the mini environment. Therefore, there is a possibility that such dust enters into the pod. To reduce the possibility of the entrance of dust into the pod, the flow rate of the down-flow may be increased. But use of this countermeasure leads to an unduly large increase in the amount of inert gas used, which will be a problem in terms of semiconductor manufacturing cost.

In the case of the method disclosed in Japanese Patent Application Laid-Open No. 2006-005193, the amount of inert gas used can be made minimum, and this method is considered to have an advantage in terms of cost over the method disclosed in Japanese Patent Application Laid-Open No. 2004-235516. In addition, this provides other advantages that the structure of the apparatus can be made simple, that the possibility of generation of dust by gas supply and the possibility of entrance of dust into the pod are low, and that the area required to install the apparatus can be made small. However, in practice, since the direction of flow of the supplied and discharged inert gas is perpendicular to the planes in which the wafers stored in the pod extend, the gas replacement efficiency is low in the regions between the wafers, and there is a possibility that the gas cannot be replaced effectively even if purging is performed over a significantly long period of time. Furthermore, this problem can be more serious with an increase in the wafer diameter in recent years.

In the case of the method disclosed in Japanese Patent Application Laid-Open No. 2003-168727, it is necessary to prepare a chamber that can house the entire pod and means for decreasing the pressure in the interior of the chamber to a certain level. Thus, this method is disadvantageous in that the structure of the apparatus is complex and the size thereof is large. Generally, pods are stored and transported in environments in which the degree of cleanness is much lower than those in the interior of the pods, in the interior of the chamber, and in the aforementioned mini environment. For this reason, on the outer surface of the pod are dust or impurity gases etc. that have attached thereto. Thus, when the pod is brought into the chamber, the environment in the chamber can be contaminated with the extraneous matters. The possibility of such contamination can be excluded by replacing the atmosphere around the pod with high purity gas before opening the lid of the pod. However, this necessarily requires time for the gas replacement operation, and there arises a problem of elongation of the processing time. This problem can be more serious with an increase in the pod size necessitated by an increase in the wafer diameter in recent years.

SUMMARY OF THE INVENTION

The present invention has been made in view of the above described background, and has as an object to provide a gas replacement apparatus that can replace the gas in the interior of the pod quickly and efficiently. It is also an object of the present invention to provide a gas replacement apparatus that enables a reduction in the possibility of entrance of dust or the like generated from a pod and peripheral movable elements in gas replacement operations into the interior of the pod, which will have to be taken care of in order to enhance the production efficiency with an increase in the wafer diameter in the future. It is a further object of the present invention to provide an apparatus and method for opening and closing a lid of a closed container or pod that can be used in such a gas replacement apparatus, and a load port apparatus using such an opening and closing apparatus.

To achieve one of the above objects, according to one aspect of the present invention, there is provided a lid opening and closing apparatus for opening and closing a closed container having a substantially box-like main body having an opening on one side in which an object to be stored can be stored, a flat plate-like lid that can be separated from the main body and close the opening to form a closed space in cooperation with the main body, and a latch mechanism that is operable from the outer surface of the lid and can fix the lid to the main body, comprising an outer wall that is parallel to the lid and has an opening portion that is large enough to allow the lid that is kept in a parallel state to pass through it while maintaining the held state, a door that can substantially close the opening portion and has a latch mechanism drive member that enables, in cooperation with the latch mechanism in the vicinity of the outer surface of the lid, switching between a state in which the lid is fixed to the main body and a state in which the lid is not fixed to the main body, and a holding member that acts on the outer surface of the lid to hold the lid, and a seal member that is provided on a surface of the door facing the lid in such a way as to surround a movable member that includes at least one of the latch mechanism drive member and the holding member, the seal member separating the movable member spatially from an environment space in a state in which the door is holding the lid.

To achieve one of the above objects, according to another aspect of the present invention, there is provided a gas replacement apparatus comprising the above described lid opening and closing apparatus, a cabinet that constitutes a chamber with walls including the outer wall, a door drive mechanism that is disposed outside the chamber and can move the door toward and away from the lid, a bellows that spatially separates a joining portion of the door drive mechanism and the door from the chamber, a latch member drive mechanism that is connected to the latch mechanism drive member and drives the latch mechanism drive member, a gas nozzle that can supply inert gas into the interior of the chamber, and an exhaust port through which surplus of the inert gas supplied into the chamber is exhausted, the exhaust port being capable of maintaining the pressure in the interior of the chamber at a level higher than the pressure outside the chamber.

To achieve one of the above objects, according to still another aspect of the present invention, there is provided a load port apparatus comprising the above described lid opening and closing apparatus, a support table on which the closed container can be placed and that is disposed just in front of the opening portion of the outer wall and can displace the closed container toward and away from the opening portion, and a door drive mechanism that can drive the door between a position at which it substantially closes the opening portion and a position at which it leaves the opening portion open.

According to the present invention, replacement of the gas in the interior of a pod can be performed through the opening of the pod. The present invention enables quick and effective gas replacement. According to the present invention, purging can be performed in a state in which the interior of a purge chamber (i.e. a chamber used for purging) is kept at a pressure a little higher than the atmospheric pressure, and therefore the gas replacement apparatus can be constructed by providing only a space needed to open and close the lid. Thus, the volume of the interior space of the chamber serving as a closed space used in gas replacement can be minimized, and therefore the quantity of inert gas needed in the replacement process can be made smaller.

According to the present invention, the elements of the pod that are brought into the chamber may be only the lid. Therefore, the elements brought into the chamber that have been stored in an environment in which the degree of cleanness is lower than that in the interior of the chamber and the pod can be made minimum. Thus, contamination of wafers or the like with contaminants associate with such elements can be reduced as much as possible. In connection with this, entrance of dust generated from a movable portion of such an element into the chamber can be prevented from occurring by providing a seal to separate the movable portion from the interior space of the chamber. Furthermore, by preventing ambient air from entering into the chamber through an apparatus for opening and closing the lid, the degree of purity of the inert gas in the interior of the chamber can be kept at a higher level. In addition, since while purging is performed, a significantly large area of the lid of the pod that has been exposed to the ambient air while storage is prevented from being exposed to the clean space formed during the purging. Therefore, scattering of contaminants in the chamber from the surface of the lid can be prevented.

The above and other objects, features, and advantages of the invention will become more apparent from the following detailed description taken in conjunction with the accompanying drawings.

DESCRIPTION OF THE EMBODIMENTS

Figure 1:
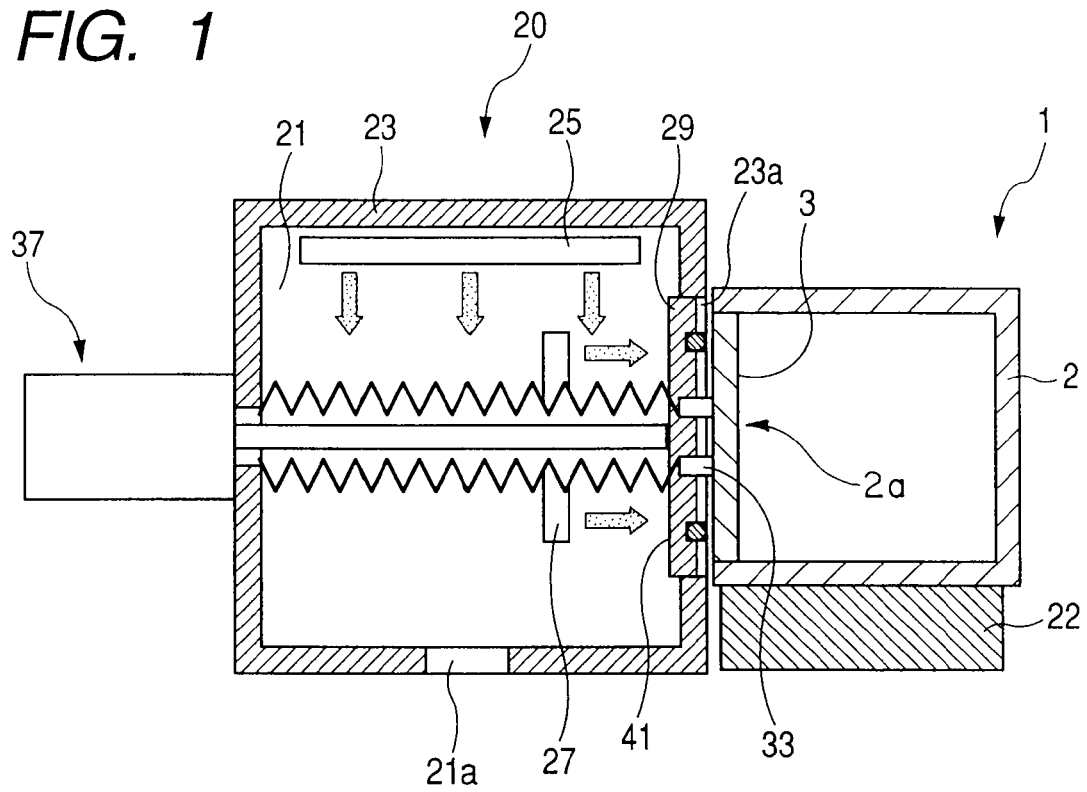
FIG. 1 is a diagram schematically showing the general structure of a purge apparatus to which an embodiment of the lid opening and closing apparatus according to the present invention is applied.

An embodiment of the present invention will be described in the following with reference to the accompanying drawings. FIG. 1 is a diagram schematically showing a cross section of a gas replacement apparatus equipped with an apparatus for opening and closing the lid of a pod according to the present invention, and a pod loaded on the gas replacement apparatus. The pod 1 shown in FIG. 1 has a substantially cubical main body 2 having an opening 2a on one side thereof and a lid 3 that closes the opening 2a.

Figure 2:
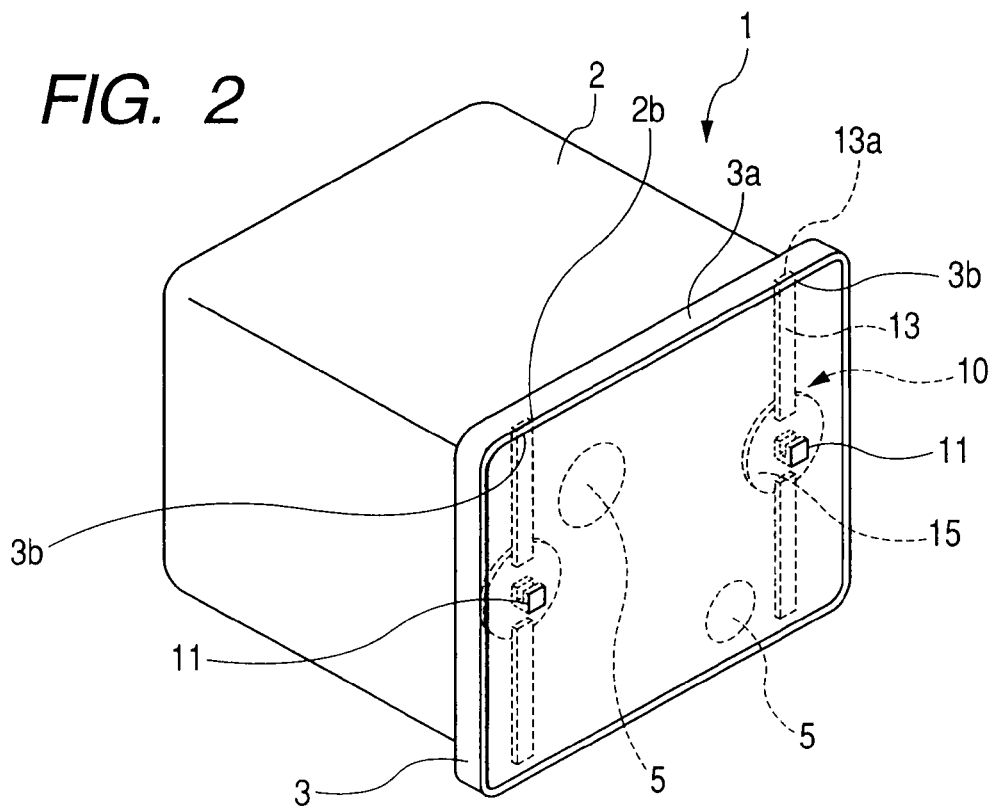
FIG. 2 is a perspective view showing the general structure of a FOUP (pod) having a lid that is to be opened and closed by the lid opening and closing apparatus according to the present invention.
Figure 3A:
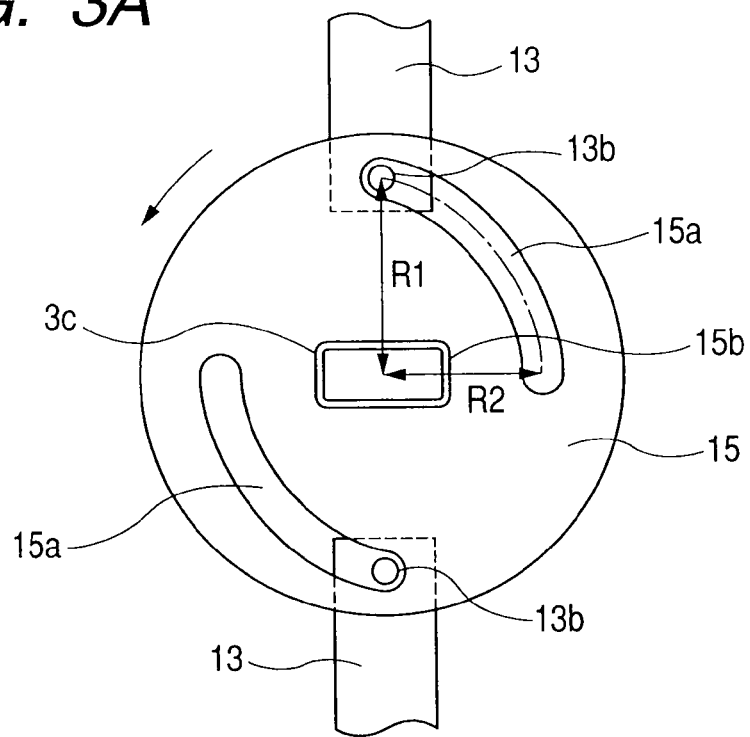
FIG. 3A is an enlarged view of a relevant portion of a latch mechanism of the pod shown in FIG. 2.
Figure 3B:
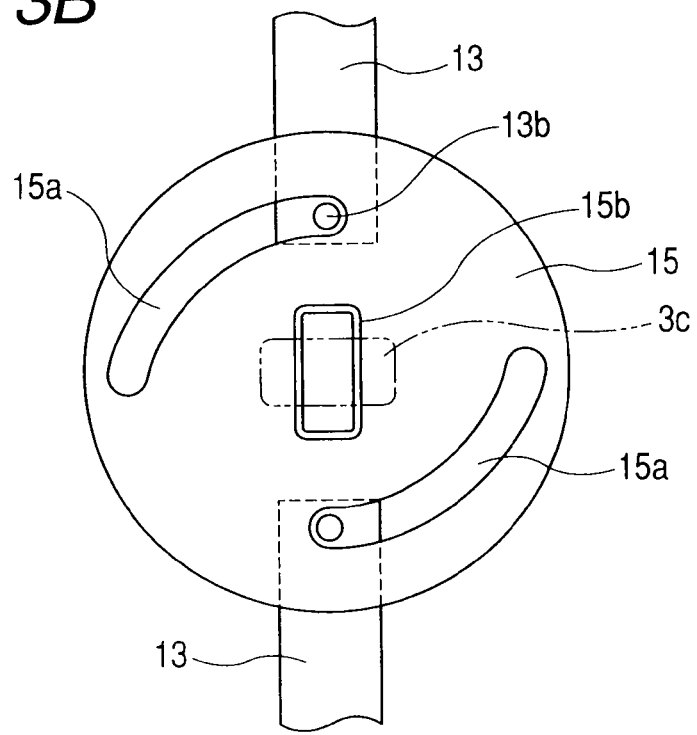
FIG. 3B is another enlarged view of the relevant portion of a latch mechanism of the pod shown in FIG. 2.

Here, the structure of the pod 1 that is used with the apparatus according to the present invention will be briefly described with reference to FIGS. 2, 3A, and 3B. FIG. 2 is a schematic perspective view of the pod. FIGS. 3A and 3B are enlarged front views of a latch mechanism, showing a latched state and an unlatched state respectively. The lid 3 has a flat plate-like shape having an outer side surface (the surface to be opposed to the lid opening and closing apparatus) on which suction regions 5 and receiving holes 11 that are in communication with rectangular holes 3c (which will be described later with reference to FIG. 3A) of a latch mechanisms 10 are provided. The latch mechanism 10 is accommodated in the interior of the flat plate-like lid 3, and the receiving holes 11 are disposed in such a way that they are in communication with the rectangular holes 3c when the rectangular holes 3c are located at specific positions. The suction regions 5 are adapted to be sucked by suction pads (which will be described later) provided on the lid opening and closing apparatus. The surface of the suction regions is made smooth so that the lid can be held by suction by the suction pad easily and reliably. The lid 3 is provided with two latch mechanisms, each of which is composed of a latch bar 13 and a disk 15. These components are provided in the interior of the lid 3. The latch bar 13 is a plate-like member extending in one direction and has a portion that functions as a latch tongue 13a at one end (front end) thereof and a connection pin 13b at the other end (rear end). The connection pin 13b stands perpendicularly from the extending surface of the latch bar 13. The latch tongue 13a has a width and a thickness that allow it to project from a projection hole 3b provided on the outer circumferential surface 3a of the lid 3. The latch bar 13 is provided for each projection hole 3b. On each of the upper and lower sides of the circumference surface 3a of the lid 3 are two projection holes 3b. The projection holes 3b on the opposed sides are parallel and opposed to each other. Two latch bars 13 associated with opposed projection holes 3b are aligned with each other along the direction in which they extend so that they can project from the projection holes by sliding along the axial direction.

The disk 15 is disposed in such a way that its center is located at the center of the gap between the latch bars 13 that are aligned along the longitudinal direction. The disk 15 is supported in such a way as to be rotatable relative to the lid 3. The disk 15 has cam grooves 15a disposed symmetrically with respect to the rotation center and a rectangular key receiving hole 15b elongated in one direction. The center of the rectangular key receiving hole coincides with the center of the disk 15. The cam groove 15a extends over a range that forms an angle of 90 degrees with respect to the center of the disk 15, and the distance R1 between the center of the width of the groove at one end and the center of the disk is difference from the distance R2 between the center of the width of the groove at the other end and the center of the disk. The connection pin 13b mentioned above is inserted through the cam groove 15a. With the above configuration, when the disk 15 is rotated by a latch key (which will be described later) inserted in the key receiving hole 15b, the distance between the connection pin 13b and the center of the disk changes along the cam groove 15a, which causes the latch bar 13 to slide or move along the longitudinal direction. By designing the length of the latch bar 13 appropriately, the state in which the latch tongue 13a projects beyond the outer circumference of the lid 3a and the state in which it is received in the lid 3a are achieved, namely the states of the disk 15 shown in FIG. 3A (in which the latch bar 13 is extended) and in FIG. 3B (in which the latch bar 13 is retracted) respectively.

In connection with the latch mechanism 10 accommodated in the interior of the lid 3, a rectangular hole 3c is provided at a position on the outer surface of the lid 3 that is aligned with the key receiving hole 15b in the state shown in FIG. 3A. As will be described later, the latch key has a T-shape with an enlarged diameter portion having a thickness substantially equal to or smaller than the depth of the key receiving hole 15b. Therefore, when the latch key is fully received in the rectangular hole 3c, the outer wall of the lid does not hinder the rotation of the latch key and the disk 15 at all. By operating the latch mechanisms having the above described structure, the latch tongues 13a can be projected into/retracted from tongue receiving holes 2b provided on the pod main body 2, whereby fixation/detachment of the lid 3 to/from the pod main body 2 can be achieved.

The gas replacement apparatus 20 according to this embodiment of the present invention is an apparatus for detaching the lid 3 from the above described pod 1 and replacing the gas enclosed in the interior of the pod with fresh, clean nitrogen gas. As shown in FIG. 1, the gas replacement apparatus 20 has a pod table 22 for supporting the pod main body 2, a cabinet 23 that defines a purge chamber 21, a first gas nozzle 25 and second gas nozzles 27 provided in the purge chamber 21, and a plate drive mechanism 37 that includes and is adapted to drive a chamber plate 29 that can close a cabinet opening 23a provided on the cabinet 23. The pod table 22 has a support table on which the pod main body 2a is actually placed, a positioning mechanism provided on the support table that regulates the position of the pod main body 2 placed on the support table, a fixing mechanism for fixing the pod main body 2 on the support table after positioning, a support table drive mechanism that moves the pod main body 2 thus positioned together with the support table toward the purge chamber 21 to bring the pod 1 to a position at which the lid 3 comes in contact with the chamber plate 29. The components of the pod table 22 may be the same as, for example, those described in Japanese Patent Application Laid-Open No. 2004-235516, and they will not be described here in detail.

The first gas nozzle 25 is disposed near the ceiling of the purge chamber 21 and adapted to be able to create flow of nitrogen gas as inert gas for purging directed from top to bottom of the chamber. The cabinet 23 has an exhaust port 21a provided on the bottom wall of the purge chamber 21. The exhaust port 21a is connected with an exhaust system (not shown), so that the gas in the interior of the chamber 21 and the inert gas supplied from the first gas nozzle 25 can be discharged therethrough. The cabinet opening 23a is provided at a position just opposed to the opening 2a of the pod main body 2 placed on the pod table 22. The size of the cabinet opening 23a is large enough to allow the lid 3 to pass through it in a state in which the plane of the opening and the plane of the lid 3 are kept in parallel. The second gas nozzles 27 are provided in the vicinity of the cabinet opening 23a and arranged parallel to the side edges of the cabinet opening 23a that extend in the vertical direction in this embodiment. The direction of gas supply from the second gas nozzles 27 is arranged in such a way that it can supply inert gas directly into the interior of the pod main body 2 in a state in which the purge chamber 21 and the interior space of the pod main body 2 are in communication with each other.

Figure 4:
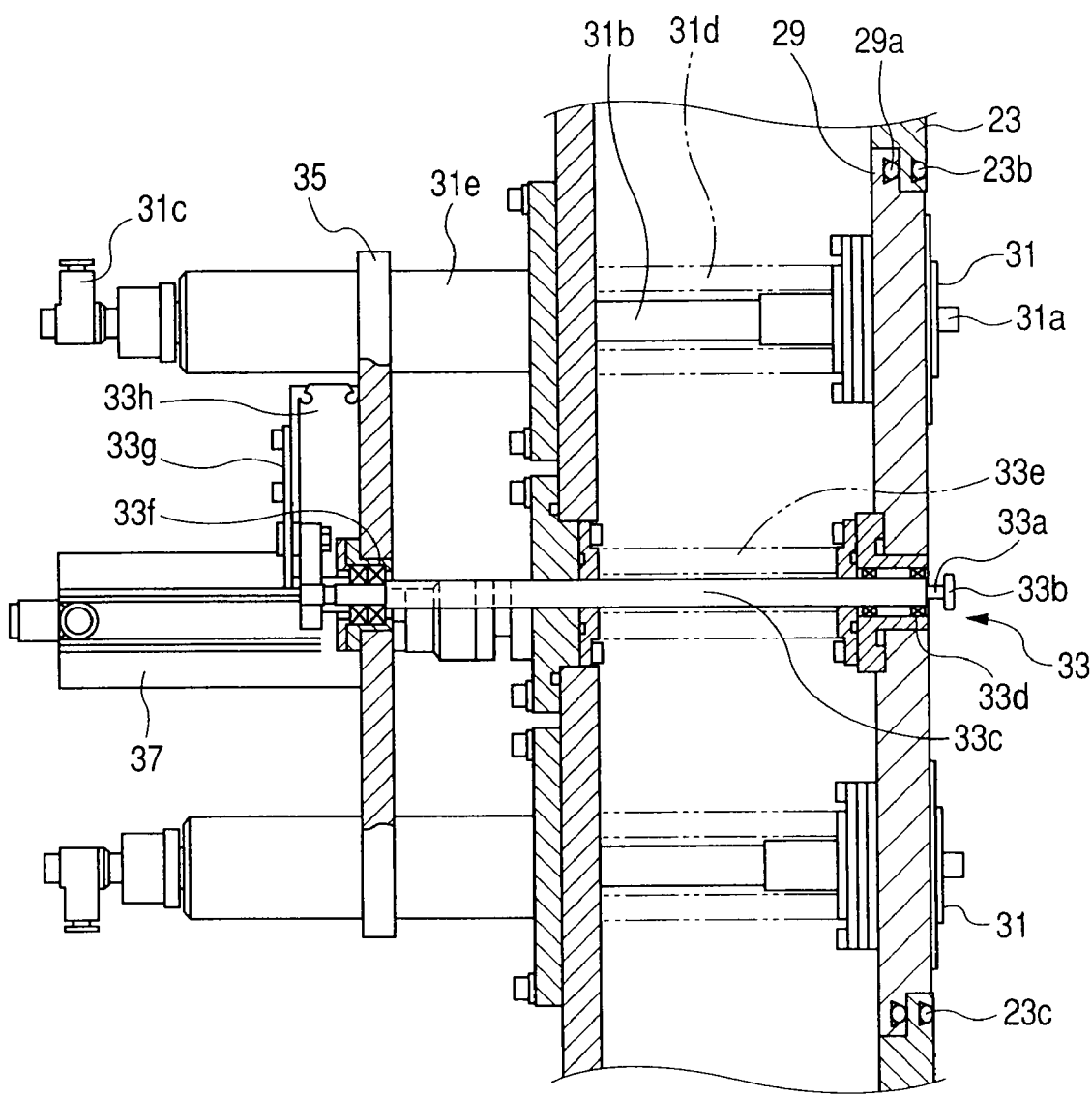
FIG. 4 is a cross sectional view showing the general structure of a relevant portion of the purge apparatus shown in FIG. 1.

In the following, the chamber plate 29 and elements relevant thereto will be described. FIG. 4 is a schematic diagram showing the chamber plate and elements relevant thereto partly in cross section taken on the plane containing a plate drive axis and a vertical axis. A cabinet wall seal member 23b is provided on the outer (or exterior side) surface of the wall of the cabinet 23 around the cabinet opening 23a. The cabinet wall seal member 23b surrounds the opening 23a and is to be in contact with the surface of the pod main body 2 opposed thereto so as to separate or isolate the interior space of the pod 1 from the space outside the purge chamber 21 and the pod 2. A plate seal member 29a is provided in the region on the lid side surface of the chamber plate 29 that is opposed to the portion of the inner (or chamber side) surface of the cabinet 23 that surrounds the cabinet opening 23a. The plate seal member 29a surrounds the cabinet opening and is to be in contact with the inner surface of the cabinet 23 to seal the cabinet opening 23a. The chamber plate 29 has suction pads 31 and latch keys 33 provided on its lid side surface (i.e. the surface facing the lid 3).

The suction pad 31 is a disk-like elastic member. The suction pad 31 is provided with a registration pin 31a at the center of its disk-like shape. The registration pin 31a is intended to be fitted into a positioning hole provided on the surface of the lid 3 to align the suction pad 31 with the suction region on the surface of the lid 3. The suction pad 31 is in communication with a suction line 31b provided on the rear side of the chamber plate 29. The suction line 31b is connected with a vacuum system (not shown) via a suction port 31c. It is necessary that the suction line 31b can extend and contract in the purge chamber 21 along its longitudinal direction with the movement of the chamber plate 29 in the axial direction (which will be described later). To this end, the portion of the suction line 31b in the purge chamber 21 is enclosed in a suction line bellows 31d and separated spatially from the interior space of the chamber 21. The portion of the suction line 31b that extends outside the suction line bellows 31d is enclosed in a hollow pipe 31e. The enclosed portion extends to the suction port 31c. The hollow pipe 31e is fixed on a slide plate 35 that will be described later so that it can move integrally with the chamber plate 29 without wobbling as the chamber plate 29 moves in the axial direction.

The portion of the latch key 33 that extends beyond the lid side surface of the chamber plate 29 includes a cylindrical portion 33a extending in the axial direction and having a decreased diameter and a substantially cubical key portion 33b connected to the front end of the cylindrical portion 33a, extending in the direction perpendicular to the axial direction, and having a length larger than the diameter of the cylindrical portion 33a. When the latch key 33 actually operates the above described latch mechanism 10, the key portion 33b is inserted through the key receiving hole 15b, and the key portion 33b is turned about its axis, whereby the disk 15 is moved. The cylindrical portion 33a is joined, at its rear end, to the front end of a latch shaft 33c. The latch shaft 33c is supported on the chamber plate 29 using a pair of bearings 33d in such a way that it can rotate about its axis. The portion of the latch shaft 33c in the purge chamber 21 is enclosed in a latch shaft bellows 33e, whereby the latch shaft 33c is spatially isolated from the interior space of the chamber 21. The latch shaft 33c is supported on a slide plate 35 using an external bearing 33f at a position outside the purge chamber 21 in such a way that it can rotate about its axis. The latch shaft 33c is connected, at its rear end, with a latch key drive mechanism 35h via a latch slider 33g. The latch key drive mechanism 35h is a single-axis (or linear) drive mechanism such as a well-known air cylinder (or pneumatic cylinder). The latch slider 33g converts the linear motion of the air cylinder into rotational motion of the latch shaft 33c.

The slide plate 35 is connected with a plate drive mechanism 37. The plate drive mechanism 37 is fixed on the main body of the gas replacement apparatus 20. The plate drive mechanism 30 causes the slide plate 35 to move toward the cabinet opening 23c. With the movement of the slide plate, the suction lines 31b and the latch shaft 33c supported on the slide plate 35 move integrally with the slide plate 35 and the chamber plate 29, whereby they extend or contract along the axis of the latch shaft 33c extending toward the cabinet opening 23c. One end of the movement range of the slide plate 35 is limited by abutment of the chamber plate 29 with the wall of the cabinet 23 with the plate seal member 29a between when the slide plate 35 comes to a position closest to the purge chamber 21. When the plate 35 is at a position farthest from the purge chamber 21, the chamber plate 29 is holding the lid 3 and located farthest from the cabinet opening 23c.

The suction pads 31 are in close contact with the smooth suction regions 5 on the surface of the lid 3 to hold the lid 3. Therefore, in the state in which the suction pad 31 is holding the lid 3, the registration pin 31a and the interior of the suction pad 31 are completely sealed, by an elastic member made of e.g. a rubber that actually applies suction in the lid 3 and the suction pad 31, against the space inside the purge chamber 21 and the interior space of the pod main body 2. On the other hand, when a certain degree of purity of inert gas is to be maintained, it is considered that the latch key 33 allows the space including the space inside the purge chamber 21 and the interior space of the pod main body 2 to communicate with the exterior space via the bearing 33d. In addition, there is a possibility that dust is generated by elements of the latch mechanism in the latching operation. In the present invention, an annular seal member is provided on the front surface (i.e. the surface facing to the lid 3) of the chamber plate 29 in such a way as to surround the region in which the latch mechanism 10 is disposed.

Figure 5A:
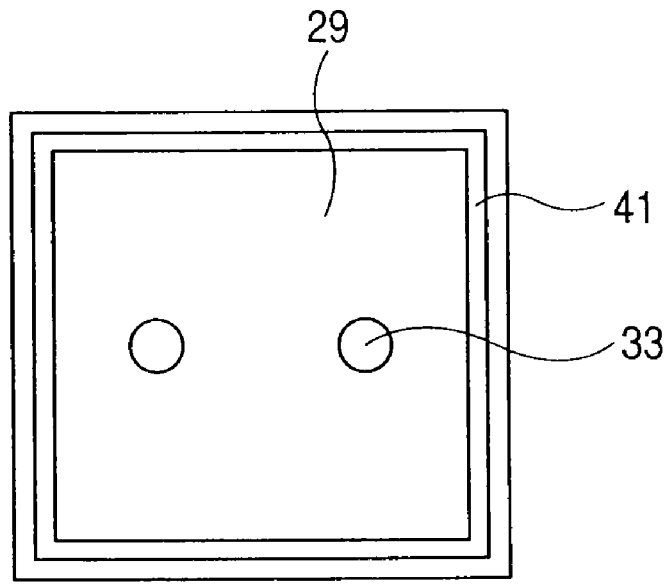
FIG. 5A schematically shows an arrangement of seal members in an embodiment of the lid opening and closing apparatus according to the present invention.
Figure 5B:
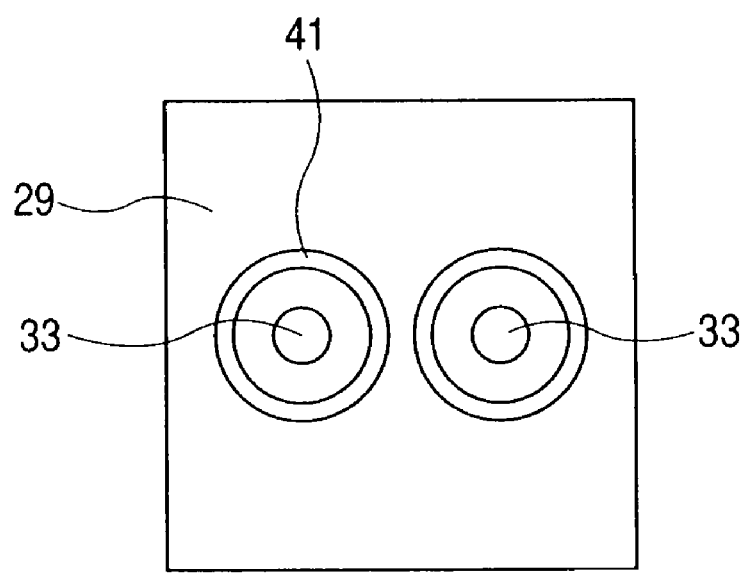
FIG. 5B schematically shows another arrangement of seal members in an embodiment of the lid opening and closing apparatus according to the present invention.

FIGS. 5A and 5B schematically show the chamber plate 29 as seen from the front side, where the suction pads 31 etc. are not illustrated to facilitate understanding. In FIG. 5A, the seal member 41 has a shape similar to the outer contour of the chamber plate 29 and is configured to surround not only both of the two latch mechanisms 10 but also substantially all the elements including the suction pads exposed on the chamber plate 29. When the chamber plate 29 is holding the lid 3, the space formed between them is separated from the surrounding space by the seal member 41. Use of this seal member 41 enables a reduction or elimination of the possibility of communication between the exterior space and the space including the space inside the purge chamber 21 and the interior space of the pod main body 2 through the latch mechanisms 10.

The lid 3 is pressed against and fixed on the chamber plate 29 by the lid 3 retaining force of the latch mechanisms 10 and suction pads 31 and a biasing force exerted by the pod table 2, in practical cases. Since the force thus exerted on the seal member 41 between the lid 3 and the chamber plate 29 is not so strong, the seal member 41 may be incapable of providing reliable sealing in some cases. However, when purging of the interior of the pod is performed, the pressure inside the purge chamber 21 and the pod is basically kept to be a little higher than the atmospheric pressure. Therefore, gas flow between the space between the lid 3 and the chamber plate 29 and the interior space of the purge chamber 21 and the pod can be blocked to some extent. Practically, if flowing of the gas enclosed in the space between the lid 3 and the chamber plate 29 into the interior space of the purge chamber 21 and the pod is prevented to some extent, flowing of the gas out of the space between the lid 3 and the chamber plate 29 into the interior space can be substantially prevented thank to the difference in the pressure between these spaces. The pod 1 has been stored and transported in a space in which the degree of cleanness is relatively low, and therefore there may be dust or the like adhering on the surface of the lid 3. Use of the seal member 41 prevents entrance of such dust into the interior space of the purge chamber 21 and the pod.

For example, when the degree of purity of the inert gas enclosed in the purge chamber 21 and the pod is to be kept at a high level, the interior space may be once evacuated to establish a so-called semi-vacuum state, and thereafter inert gas may be supplied. If this is applied to the structure shown in FIG. 5A, there is a possibility that satisfactory sealing is not achieved due to insufficiency in the biasing force exerted on the seal member 41 or non-uniformity in the deforming force applied on the seal member 41. In the case where the above described process is used, it is preferred that seal members 41 be provided according to the mode shown in FIG. 5B. In this mode, specifically, only the regions around the latch mechanisms that can function as passages that allow external gas to flow into the interior space are surrounded by the seal members 41. In this mode, the regions around the latch mechanisms and the interior space of the purge chamber 21 and the pod can be sealed from the external space, though it is difficult to keep dust or the like on the surface of the lid 3 in the space between the lid 3 and the chamber plate 29.

Although in the above described structure, suction pads are used as elements that hold the lid, the elements are not limited to the suction pads. For example, the lid may be held by providing a projection on the surface of the lid and clamping it by a clamp member. Therefore, in the present invention, this element is defined as a holding member that holds a lid. Furthermore, although the latch mechanism used in this embodiment has the structure described above by way of example, the mode of latching actually used is not limited to this structure. The latch mechanism defined in the present invention includes any structure that is accessible from the front side of the lid and can actuate means for fixing the lid to the pod main body. The above described seal member may be arranged to surround any element that can highly possibly generate dust or can function as a passage of gas, namely any one of the members, such as the latch mechanism and the holding member, that can be considered to be movable members that operate during the actual lid opening/closing operation and can generate dust.

Figure 6A:
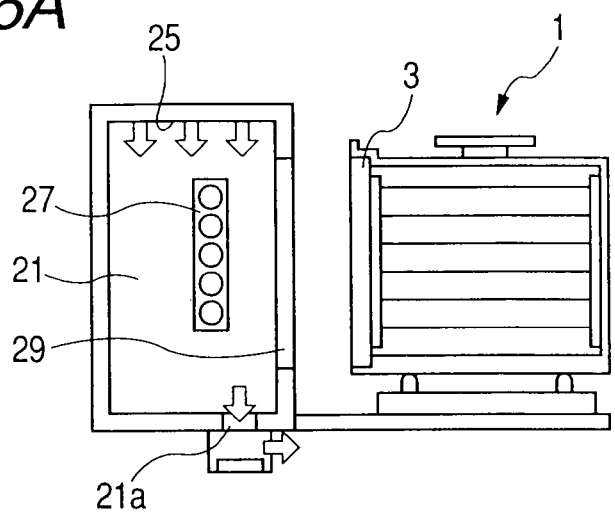
FIG. 6A schematically shows a step in the process of actually purging the pod in the purge apparatus shown in FIG. 1.

Actual purging performed by the above described purge apparatus 20 will be described in the following with reference to the drawings. FIGS. 6A to 6F show sequential stages of purging process performed on the pod 1 using the purge apparatus 20 shown in FIG. 1. The chamber plate 29 and elements relevant thereto will not be described in the following description nor illustrated in FIGS. 6A to 6F, because description and illustration thereof will make the drawings and the description unduly complicated. In FIG. 6A, the pod 1 on which purging is to be performed is fixed on the purge apparatus 20. In this state, inert gas is supplied only from the first gas nozzle 25, and surplus inert gas is discharged through the exhaust port 21a. When the purge apparatus 20 is activated initially, in order to achieve a high degree of purity of inert gas in the interior space of the purge chamber 21, the chamber 21 is evacuated through the discharge port 21a to establish a semi-vacuum state therein, and then high purity inert gas is supplied through the first gas nozzle 25. By achieving a high degree of purity at the time of initial activation, the degree of purity of inert gas in the chamber at the time when the pod is set can be maintained at a high level only by keeping the pressure in the interior space of the chamber higher than the atmospheric pressure even without performing positive evacuation of the chamber.

Figure 6B:
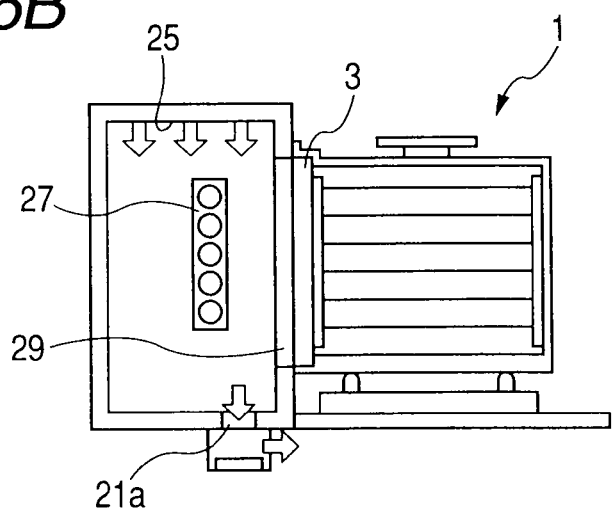
FIG. 6B schematically shows a step in the process of actually purging the pod in the purge apparatus shown in FIG. 1.
Figure 6C:
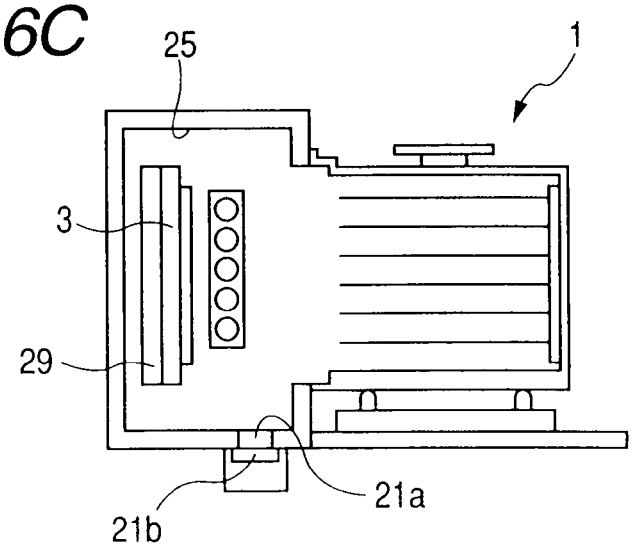
FIG. 6C schematically shows a step in the process of actually purging the pod in the purge apparatus shown in FIG. 1.

After the stage shown in FIG. 6A, the pod 1 is moved toward the purge chamber 21, and the outer circumferential portion of the pod main body and the walls around the cabinet opening 23a come in close contact with each other with the cabinet wall seal member 23b between. Simultaneously, the lid 3 is held by the suction pads 31 on the chamber plate 29, and the latch key 33 actuates the latch mechanism 10 to enable separation of the lid 3 and the pod main body 2 (FIG. 6B). Thereafter, the plate drive mechanism 37 operates to move the chamber plate 29 to the rear side of the purge chamber 21 together with the lid 3 (FIG. 6C). During this process, the exhaust port 21a is temporarily closed by the exhaust port closing valve 21b, and supply of inert gas through the first gas nozzle 25 is suspended. Thus, inert gas is not blown onto the chamber plate 29 and the lid 3 during the movement, and dust or the like adhering on the surface thereof, in particular on the front surface of the lid 3, is prevented from being scattered unnecessarily.

Figure 6D:
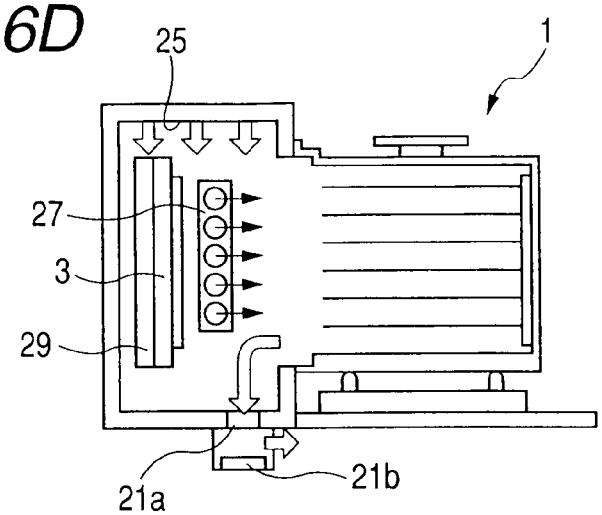
FIG. 6D schematically shows a step in the process of actually purging the pod in the purge apparatus shown in FIG. 1.

After completion of the movement of the chamber plate 29, supply of inert gas through the first gas nozzle 25 and supply of inert gas through the second gas nozzle 27 are started (FIG. 6D). During this process, the exhaust port closing valve 21b is left open to enable outflow of inert gas through the exhaust port 21a. The inert gas supplied through the first gas nozzle 25 create so-called down-flow toward the exhaust port 21a provided on the bottom of the purge chamber 21. The down-flow expels dust or the like generated or floating in the interior space of the chamber 21 due to the movement of the chamber plate 29 through the exhaust port 21a. The second gas nozzles 27 are arranged vertically on both sides of the pod opening 2a, and the nozzle orifices thereof are directed toward the interior of the pod 1. The inert gas supplied through the second gas nozzles 27 flows towards the interior of the pod to expel the gas existing in the interior of the pod from the central portion of the pod. The gas expelled out of the pod is discharged through the exhaust port 21a with the above described down-flow. By performing this process continuously for a predetermined period of time, purging of the interior of the pod 1 with high-purity inert gas is completed.

Figure 6E:
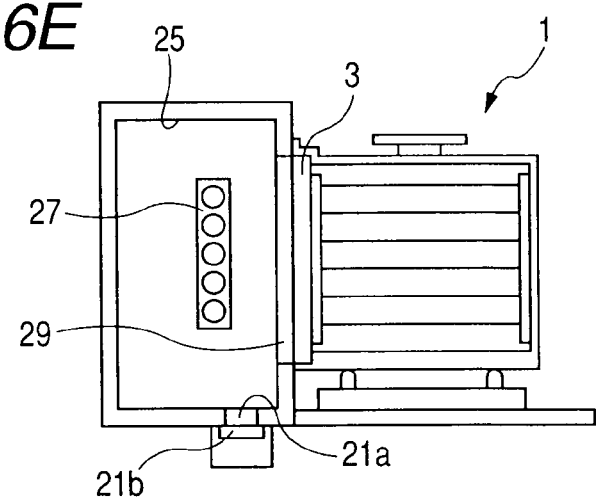
FIG. 6E schematically shows a step in the process of actually purging the pod in the purge apparatus shown in FIG. 1.
Figure 6F:
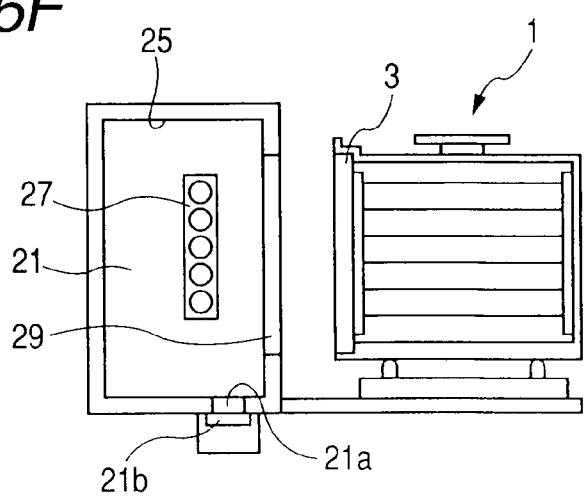
FIG. 6F schematically shows a step in the process of actually purging the pod in the purge apparatus shown in FIG. 1.

After the lapse of the predetermined period of time, the exhaust port 21a is closed by the exhaust port closing valve 21b, and gas supply through the first gas nozzle 25 and the second gas nozzles 27 is stopped. Thereafter, the chamber plate 29 is moved to the position at which it closes the cabinet opening 23a. After movement of the chamber plate 29 has been completed, holding of the lid 3 by the suction pads 31 is released, and the lid 3 is fixed to the pod main body 2 by the operation of the latch key 33 (FIG. 6E). Thereafter, the pod 1 is retracted to the position at which it was initially placed. Thus, the sequential purging process is completed (FIG. 6F). During the above described purging process, inert gas is ceaselessly introduced into the purge chamber 21. Inert gas also flows out of the chamber through the exhaust port 21a in accordance with a pressure difference between the pressure in the chamber and the atmospheric pressure. Since the exhaust port 21a is closed by the exhaust port closing valve 21b as the gas supply is suspended, the pressure in the purge chamber 21 is always kept at a positive pressure during the sequential process shown in FIGS. 6A to 6E. Since the above described seal member 41 is provided, and the environment around the latch mechanisms 10 is at the atmospheric pressure, flow of gas from the latch mechanisms to the interior of the purge chamber 21 is completely prevented. In addition, since the lid 3 or the portion around the latch key that is particularly likely to generate dust is spatially isolated by the seal member 41 from the interior space of the purge chamber 21, dust or the like generated by the operation of the latch key and other elements is completely prevented from scattering into the purge chamber 21.

As described in the foregoing, by applying the apparatus for opening and closing the lid of a pod according to the present invention to the purge apparatus, purging of the interior space of the pod can be performed favorably without being affected by dust generated by the latch key and the elements relevant thereto or entrance of impure gases into the purge chamber. According to the present invention, by providing a seal member surrounding the elements movable upon opening/closing the lid of the pod to spatially separate or isolate the region in the space formed between the chamber plate (which constitutes the door of the cabinet opening) for opening/closing the lid and the lid of the pod, in which the movable elements are present, from the interior space of the purge chamber, contamination factors in the chamber associated with the movable elements can be reduced. In the above described embodiment, the element exemplified by the chamber plate corresponds to the door in the present invention. The bellows refers to an element including a metal pipe that can extend and contract along a certain direction and flanges attached on both ends thereof. Each flange is fixed to an object via a seal member provided on the surface of the flange that is facing away from the metal pipe, whereby the interior and the exterior of the metal pipe is air-tightly isolated from each other.

In the above described embodiment, the purging apparatus has been described as a preferable apparatus to which the lid closing and opening apparatus according to the present invention is applied. However, the lid opening and closing apparatus according to the present invention may be applied to what is called a load port apparatus that is adapted to open the lid of a pod to bring the interior of the pod into communication with a mini environment provided just before the processing chamber of a semiconductor manufacturing apparatus, as described below.

Figure 7A:
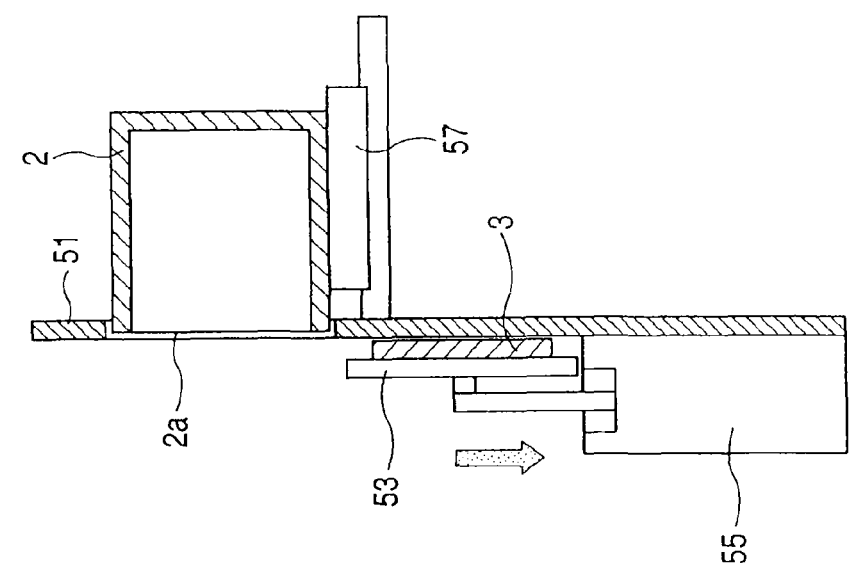
FIG. 7A is a diagram schematically showing the general structure of a load port apparatus to which an embodiment of the lid opening and closing apparatus according to the present invention is applied.
Figure 7B:
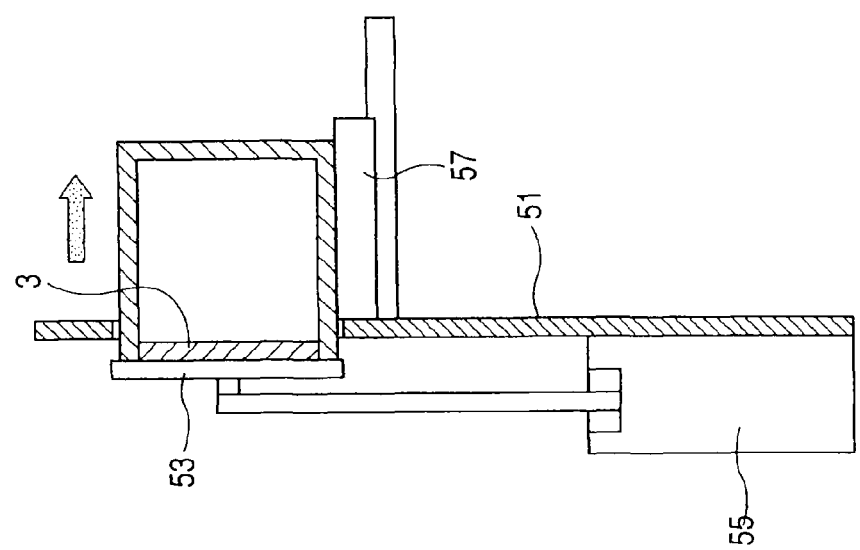
FIG. 7B is a diagram schematically showing the general structure of the load port apparatus to which the embodiment of the lid opening and closing apparatus according to the present invention is applied.
Figure 7C:
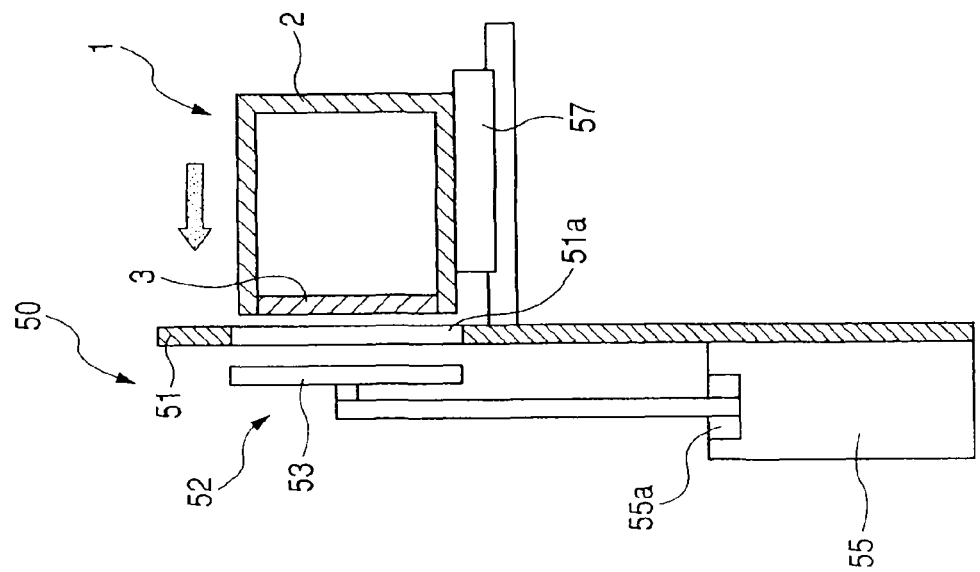
FIG. 7C is a diagram schematically showing the general structure of the load port apparatus to which the embodiment of the lid opening and closing apparatus according to the present invention is applied.

In the following, a load port apparatus to which the present invention is applied will be described with reference to the drawings. FIGS. 7A to 7C are cross sectional views of a load port apparatus 50 and a pod 1 placed thereon, showing some stages in the process of opening/closing the lid 3 of the pod 1. In FIGS. 7A to 7C, the load port apparatus 50 has an outer wall 51 having a port opening 51a, a port door 53 that can substantially or nearly close the port opening 51a, a door drive mechanism 55 that drives the port door 53, and a support table 57 on which a pod 1 is to be placed. The port door 53 has suction pads and latch mechanisms as with the chamber plate 29 described above, and a seal member is provided in such a way as to surround the latch mechanism, which is a drive mechanism exposed on the surface of the port door 53. The detailed structure of the latch mechanisms is substantially the same as that in the above described embodiment, and illustration thereof is omitted in FIGS. 7A to 7C for the sake of simplification.

The port door 53 is disposed in such a way that a small gap is left between it and the outer wall 51. Thus, the port door 53 does not completely close the port opening 51a, but it nearly closes the port opening 51a with a gap. The door drive mechanism 55 has a known drive system including e.g. an air cylinder that can move the door vertically downwardly to open the port opening 51a. The drive system is accommodated in a box provided below the port opening 51a, and only a support arm 53a that supports the port door 53 via a magnetic fluid seal 55a is exposed in the mini environment 52. On the left of the outer wall 51 in FIGS. 7A to 7C is provided a chamber having walls, in which down-flow is created. Thus, the interior of the chamber serves as a mini environment in which degree of cleanness is controlled. The support table 57 can fix the pod 1 at a predetermined position thereon and move the pod 1 toward/away from the pod opening 51a, as with the above described pod table 22 in the previous embodiment.

In the following, the process of opening the lid 3 of the pod 1 will be described with reference to FIGS. 7A to 7C. The pod 1 is placed on the support table 57, and the pod 1 is moved toward the port opening 51a (FIG. 7A). When the lid 3 abuts the surface of the port door 53, the suction pads and the latch mechanisms are actuated to enable separation of the lid 3 from the pod main body 2 and holding of the lid 3 by the suction pads (FIG. 7B). Thereafter, the support table 57 operates to displace the pod main body 2 away from the port door 53. By this operation, the lid 3 is separated from the pod main body 2. Thereafter, the door drive mechanism 55 moves the port door 53 downwardly together with the lid 3 (FIG. 7C). Thus after the above described process, wafers or the like stored in the interior of the pod 1 can be taken out.

Normally, in the above described load port apparatus 50, so-called down-flow is created in the mini environment 52 to maintain the degree of cleanness in it. The operation of opening/closing the lid 3 and movement of the port door 53 are normally performed under the presence of the down-flow. In conventional apparatuses, the lid 3, the port door 53, and a part of the latch mechanisms present in the space between the lid 3 and the port door 53 is exposed to the down-flow. Therefore, there is a possibility that dust is generated from the latch mechanisms and/or other elements and/or that dust generated from individual elements is scattered. By using the lid opening and closing apparatus according to the present invention, the movable elements such as the latch mechanisms is isolated from the mini environment by the seal member. Therefore, detrimental effects of dust or the like can be prevented.

As many apparently widely different embodiments of the present invention can be made without departing from the spirit and scope thereof, it is to be understood that the invention is not limited to the specific embodiments thereof except as defined in the appended claims.

What is claimed is:

1. A lid opening and closing apparatus for opening and closing a closed container having a substantially box-shaped main body having an opening on one side in which an object to be stored can be stored, a flat plate-shaped lid that can be separated from said main body and close said opening to form a closed space in cooperation with said main body, and a latch mechanism that is operable from an outer surface of said lid and can fix said lid to said main body, comprising:

an outer wall that is parallel to said lid and has an opening portion that is large enough to allow said lid that is kept in a parallel state to pass through it while maintaining the held state;

a door that can close said opening portion and has a latch mechanism drive member that enables, in cooperation with said latch mechanism in the vicinity of the outer surface of said lid, switching between a state in which said lid is fixed to said main body and a state in which said lid is not fixed to said main body, and a holding member provided on a surface of said door, that acts on said outer surface of said lid to hold said lid;

a seal member provided on a surface of said door facing said lid in such a way as to surround a movable member that includes at least one of said latch mechanism drive member and said holding member, the seal member separating said movable member spatially from an environment space in a state in which said door is holding said lid;

a cabinet that constitutes a chamber with walls including said outer wall;

a latch shaft that penetrates said door from an exterior space of said chamber through an inside of said chamber and a rear surface of said door to link with said latch mechanism drive member, and holds said door, so as to move said latch mechanism drive member;

a holding member operation shaft that penetrates said door from the exterior space of said chamber through an interior space of said chamber and a rear surface of said door to link with said holding member, and holds said door, so as to move said holding member;

a slide plate that supports said latch shaft and said holding member operation shaft at the exterior space of said chamber;

a plate drive mechanism that is located in the exterior space of said chamber, causes said slide plate to move in a direction along which said latch shaft extends to slide said latch shaft and said holding member operation shaft between the interior space of said chamber and the exterior space of said chamber, so as to move said door between a position at which said door closes said opening and a position at which said door opens said opening; and a plurality of bellows, each of which encloses one of said holding member operation shaft and said latch shaft within said chamber, to spatially separate said holding member operation shaft and said latch shaft from the interior space of said chamber.

2. The lid opening and closing apparatus as recited in claim 1, wherein said seal member is provided for said movable member in a state where said door holds said lid, to spatially separate said holding member operation shaft and said latch shaft from the interior space of said chamber.

3. A gas replacement apparatus comprising:

the lid opening and closing apparatus as recited in claim 1;

a gas nozzle that can supply inert gas into the interior of said chamber; and an exhaust port through which surplus of said inert gas supplied into the chamber is exhausted, said exhaust port being capable of maintaining the pressure in the interior of said chamber at a level higher than the pressure in the exterior of said chamber.

* * * * *